(12) United States Patent
Annunziata et al.

(10) Patent No.: US 8,971,103 B2
(45) Date of Patent: Mar. 3, 2015

(54) THERMALLY-ASSISTED MRAM WITH FERROMAGNETIC LAYERS WITH TEMPERATURE DEPENDENT MAGNETIZATION

(71) Applicant: International Business Machines Corporation, Armonk, NY (US)

(72) Inventors: Anthony J. Annunziata, Stamford, CT (US); Philip L. Trouilloud, Norwood, NJ (US); Daniel Worledge, Cortlandt Manor, NY (US)

(73) Assignee: International Business Machines Corporation, Armonk, NY (US)

( * ) Notice: Subject to any disclaimer, the term of this patent is extended or adjusted under 35 U.S.C. 154(b) by 168 days.

(21) Appl. No.: 13/799,587

(22) Filed: Mar. 13, 2013

(65) Prior Publication Data

US 2014/0269028 A1    Sep. 18, 2014

(51) Int. Cl.
    *G11C 11/00*    (2006.01)
    *G11C 11/16*    (2006.01)

(52) U.S. Cl.
    CPC ........... *G11C 11/161* (2013.01); *Y10S 977/933* (2013.01); *Y10S 977/935* (2013.01)
    USPC ........... 365/158; 365/148; 365/171; 977/933; 977/935

(58) Field of Classification Search
    USPC ......... 365/48, 55, 62, 66, 74, 78, 80–93, 100, 365/130, 131, 148, 158, 171–173, 209, 213, 365/225.5, 230.07, 232, 243.5; 257/421, 257/E21.665; 428/810–816, 817–825.1, 428/826; 977/933–935
    See application file for complete search history.

(56) References Cited

U.S. PATENT DOCUMENTS

| | | | |
|---|---|---|---|
| 6,667,897 B1 | 12/2003 | Abraham et al. | |
| 7,684,161 B2 | 3/2010 | Pietambaram et al. | |
| 7,796,428 B2 | 9/2010 | Redon | |
| 8,102,701 B2 | 1/2012 | Prejbeanu et al. | |
| 8,208,295 B2 | 6/2012 | Dieny | |
| 8,217,478 B2 | 7/2012 | Lou et al. | |
| 2011/0110151 A1* | 5/2011 | Prejbeanu | 365/173 |

OTHER PUBLICATIONS

J. G. Deak et al., "Effect of Resistance-Area-Product and Thermal Environment on Writing of Magneto-Thermal MRAM," IEEE Transactions on Magnetics, vol. 42, Issue 10, Oct. 2006, pp. 2721-2723.

(Continued)

*Primary Examiner* — Harry W Byrne
(74) *Attorney, Agent, or Firm* — Cantor Colburn LLP; Vazken Alexanian

(57) ABSTRACT

A technique is provided for a thermally assisted magnetoresistive random access memory device. The device has a synthetic antiferromagnetic layer disposed on an antiferromagnetic layer. The synthetic antiferromagnetic layer has a first ferromagnetic storage layer, a non-magnetic coupling layer disposed on the first ferromagnetic storage layer, and a second ferromagnetic storage layer disposed on the non-magnetic coupling layer. A non-magnetic tunnel barrier is disposed on the second ferromagnetic storage layer, and a ferromagnetic sense layer is disposed on the non-magnetic tunnel barrier. A first ferromagnetic critical temperature of the first ferromagnetic storage layer is higher than an antiferromagnetic critical temperature of the antiferromagnetic layer, is higher than a second ferromagnetic critical temperature of the second ferromagnetic storage layer, and is higher than a third ferromagnetic critical temperature of the ferromagnetic sense layer.

12 Claims, 6 Drawing Sheets

(56) References Cited

OTHER PUBLICATIONS

Y. Gang et al., "A High-Reliability, Low-Power Magnetic Full Adder," IEEE Transactions on Magnetics, vol. 47, Issue 11, Nov. 2011, pp. 4611-4616.

E. Gapihan et al., "FeMn Exchange Biased Storage Layer for Thermally Assisted MRAM," IEEE Transactions on Magnetics, vol. 46, Issue 6, Jun. 2010, pp. 2486-2488.

A. Kravets et al., "Temperature-controlled interlayer exchange coupling in strong/weak ferromagnetic multilayers: a thermo-magnetic Curie-switch," arXiv:1208.1493, Aug. 2012, 15 pages, 5 figures.

* cited by examiner $T \leq T_{store}$

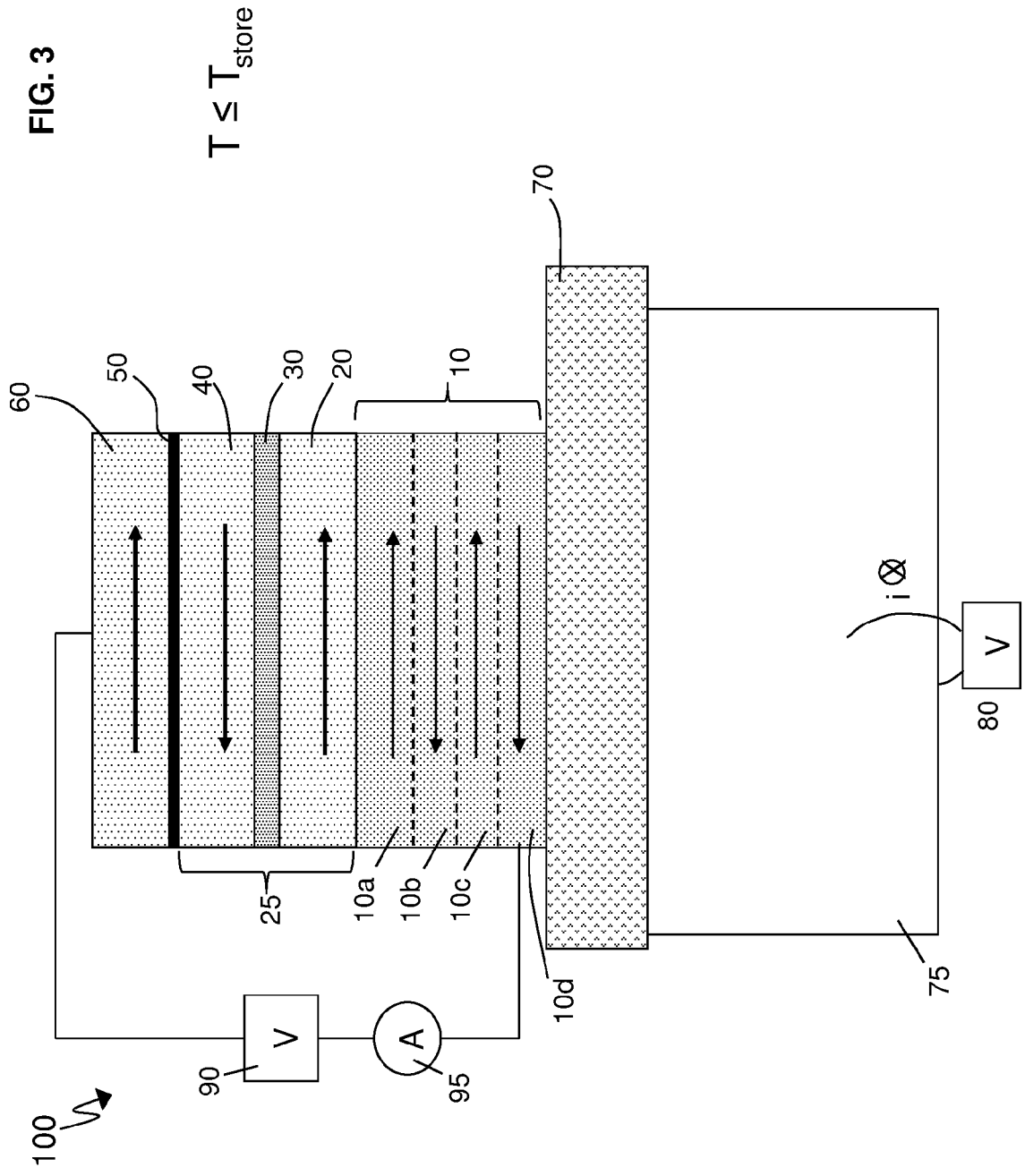

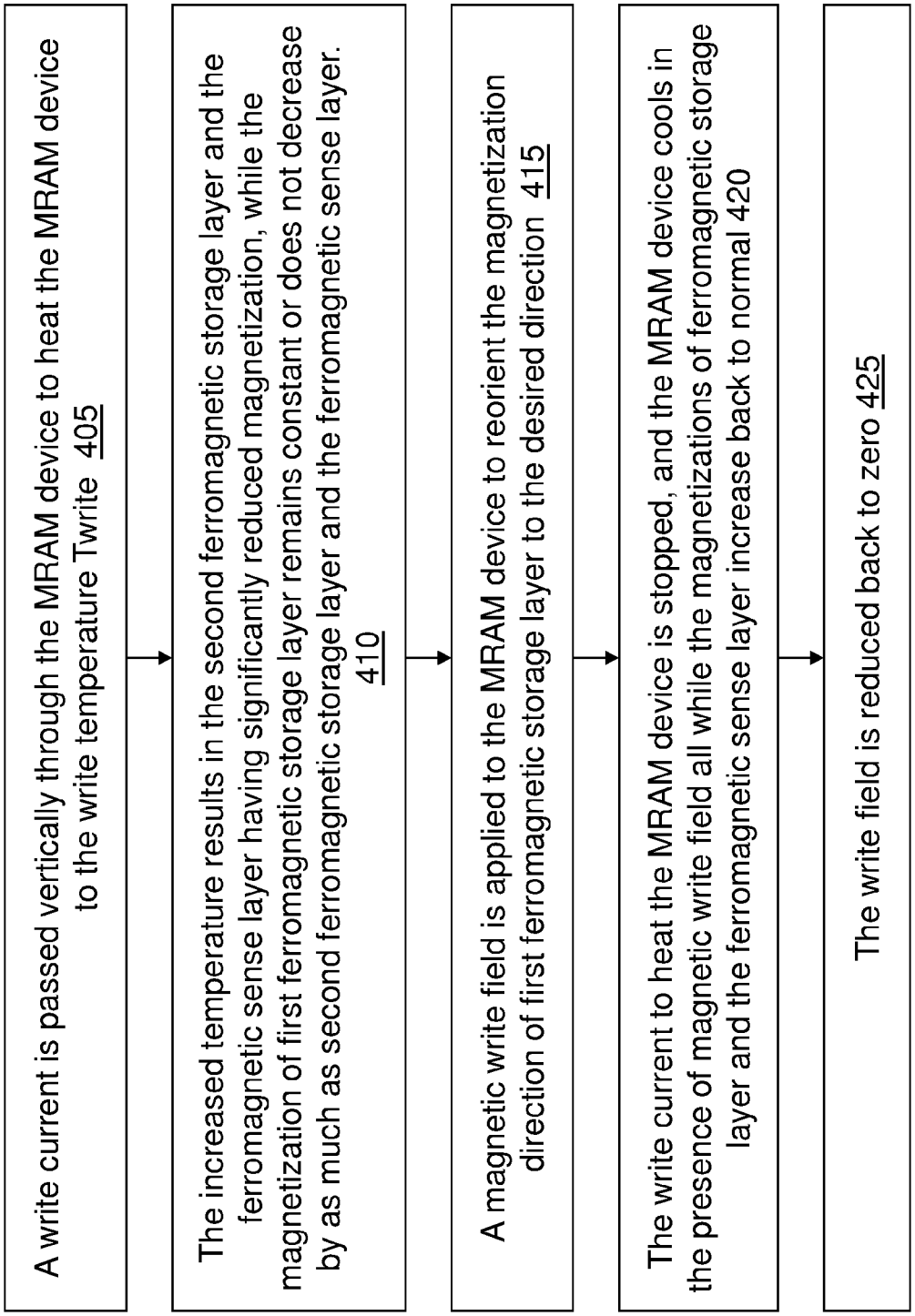

FIG. 5

Apply a write current to heat the MRAM device to a write temperature 505

→ Demagnetize respective ferromagnetisms in the second ferromagnetic storage layer and the ferromagnetic sense layer from the heat, resulting in reduced stray magnetic fields 510

→ Apply a write field that interacts with ferromagnetism of the first ferromagnetic storage layer, where the write field switches a first magnetic orientation of the first ferromagnetic storage layer, where the ferromagnetism of the first ferromagnetic storage layer is not demagnetized by the heat at the write temperature 515

→ When the write current is removed to cool the MRAM device below the write temperature, exchange bias of the first ferromagnetic storage layer switches a second magnetic orientation of the second ferromagnetic storage layer according to the first magnetic orientation of the first ferromagnetic storage layer previously switched 520

THERMALLY-ASSISTED MRAM WITH FERROMAGNETIC LAYERS WITH TEMPERATURE DEPENDENT MAGNETIZATION

BACKGROUND

The present invention relates generally to magnetic memory devices, and more specifically, to utilizing temperature dependent magnetization of ferromagnetic layers to reduce stray magnetic fields in MRAM devices.

Magnetoresistive random access memory (MRAM) is a non-volatile computer memory (NVRAM) technology. Unlike conventional RAM chip technologies, MRAM data is not stored as electric charge or current flows, but by magnetic storage elements. The elements are formed from two ferromagnetic plates, each of which can hold a magnetic field, separated by a thin insulating layer. One of the two plates is a reference magnet set to a particular polarity; the other plate's field can be changed to match that of an external field to store memory and is termed the "free magnet" or "free-layer". This configuration is known as a magnetic tunnel junction and is the simplest structure for a MRAM bit. A memory device is built from a grid of such "cells".

One method of reading is accomplished by measuring the electrical resistance of the cell. A particular cell is (typically) selected by powering an associated transistor which switches current from a supply line through the cell to ground. Due to the magnetic tunnel effect, the electrical resistance of the cell changes due to the orientation of the magnetization in the two plates. By measuring the resistance of any particular cell, the direction of magnetization of the writable plate (i.e., the free layer) can be determined.

SUMMARY

According to one embodiment, a thermally assisted magnetoresistive random access memory device is provided. The device includes an antiferromagnetic layer and a synthetic antiferromagnetic layer disposed on the antiferromagnetic layer. The synthetic antiferromagnetic layer includes a first ferromagnetic storage layer, a non-magnetic coupling layer disposed on the first ferromagnetic storage layer, and a second ferromagnetic storage layer disposed on the non-magnetic coupling layer. The device includes a non-magnetic tunnel barrier disposed on the second ferromagnetic storage layer, and a ferromagnetic sense layer disposed on the non-magnetic tunnel barrier. The first ferromagnetic critical temperature of the first ferromagnetic storage layer is higher than an antiferromagnetic critical temperature of the antiferromagnetic layer, is higher than a second ferromagnetic critical temperature of the second ferromagnetic storage layer, and is higher than a third ferromagnetic critical temperature of the ferromagnetic sense layer.

According to one embodiment, a method for writing to a thermally assisted magnetoresistive random access memory (MRAM) device is provided. The method includes applying a write current to heat the MRAM device to a write temperature. The MRAM device includes an antiferromagnetic layer and a synthetic antiferromagnetic layer disposed on the antiferromagnetic layer, where the synthetic antiferromagnetic layer comprising a first ferromagnetic storage layer, a non-magnetic coupling layer disposed on the first ferromagnetic storage layer, and a second ferromagnetic storage layer disposed on the non-magnetic coupling layer. The MRAM device further includes a non-magnetic tunnel barrier disposed on the second ferromagnetic storage layer and a ferromagnetic sense layer disposed on the non-magnetic tunnel barrier. The method includes demagnetizing respective ferromagnetisms in the second ferromagnetic storage layer and the ferromagnetic sense layer from the heat, resulting in reduced stray magnetic fields, and applying a write field that interacts with ferromagnetism of the first ferromagnetic storage layer. The write field switches a first magnetic orientation of the first ferromagnetic storage layer, and the ferromagnetism of the first ferromagnetic storage layer is not demagnetized by the heat at the write temperature. When the write current is removed to cool the MRAM device below the write temperature, exchange bias of the first ferromagnetic storage layer switches a second magnetic orientation of the second ferromagnetic storage layer according to the first magnetic orientation of the first ferromagnetic storage layer previously switched.

According to one embodiment, a method for writing to a thermally assisted magnetoresistive random access memory (MRAM) device is provided. The method includes heating the MRAM device up to a write temperature. The MRAM device includes an antiferromagnetic layer and a synthetic antiferromagnetic layer disposed on the antiferromagnetic layer, the synthetic antiferromagnetic layer comprising a first ferromagnetic storage layer, a non-magnetic coupling layer disposed on the first ferromagnetic storage layer, and a second ferromagnetic storage layer disposed on the non-magnetic coupling layer. The MRAM device further includes a non-magnetic tunnel barrier disposed on the second ferromagnetic storage layer and a ferromagnetic sense layer disposed on the non-magnetic tunnel barrier. The write temperature is below a critical temperature of the first storage layer. The write temperature is above critical temperatures of the second ferromagnetic storage layer, the ferromagnetic sense layer, and the antiferromagnetic layer. The method includes switching a first magnetic orientation of the first ferromagnetic storage layer, and cooling the MRAM device below the write temperature to switch a second magnetic orientation of the second ferromagnetic storage layer according to the first magnetic orientation of the first ferromagnetic storage layer previously switched.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

FIG. 3 illustrates the thermally-assisted magnetoresistive random access memory device when the magnetic orientations of the storage layers have been changed to store data according to an embodiment.

FIG. 4 is an example of an operation mode that reduces (eliminates or nearly eliminates) stray magnetic fields originating from a ferromagnetic storage layer and a ferromagnetic sense layer according to an embodiment.

FIG. 5 is a method for writing to the thermally assisted magnetoresistive random access memory device according to an embodiment.

DETAILED DESCRIPTION

Thermally-assisted magnetoresistive random access memory (TAS-MRAM) entails heating of the magnetic tunnel junction (MTJ) stack to a write temperature ($T_{write}$) higher than the maximum storage temperature ($T_{store}$) in order to write to the device. As the size of the MRAM devices have been reduced, stray fields are incident on other magnetic layers which requires a stronger write field to overcome the stray fields. The stray magnetic fields are magnetic field interaction of one magnet upon another magnet. In typical MRAM devices, the magnetization of the ferromagnetic layers is not strongly temperature dependent, resulting in large stray fields from these levels at both the storage temperatures and the write temperature. Stray fields can be reduced by using a synthetic antiferromagnet for the layer that stores the data, but this necessitates a complicated write method with small margin, making the design susceptible to process-induced variation in the device size, level thickness, etc.

Figure 1:
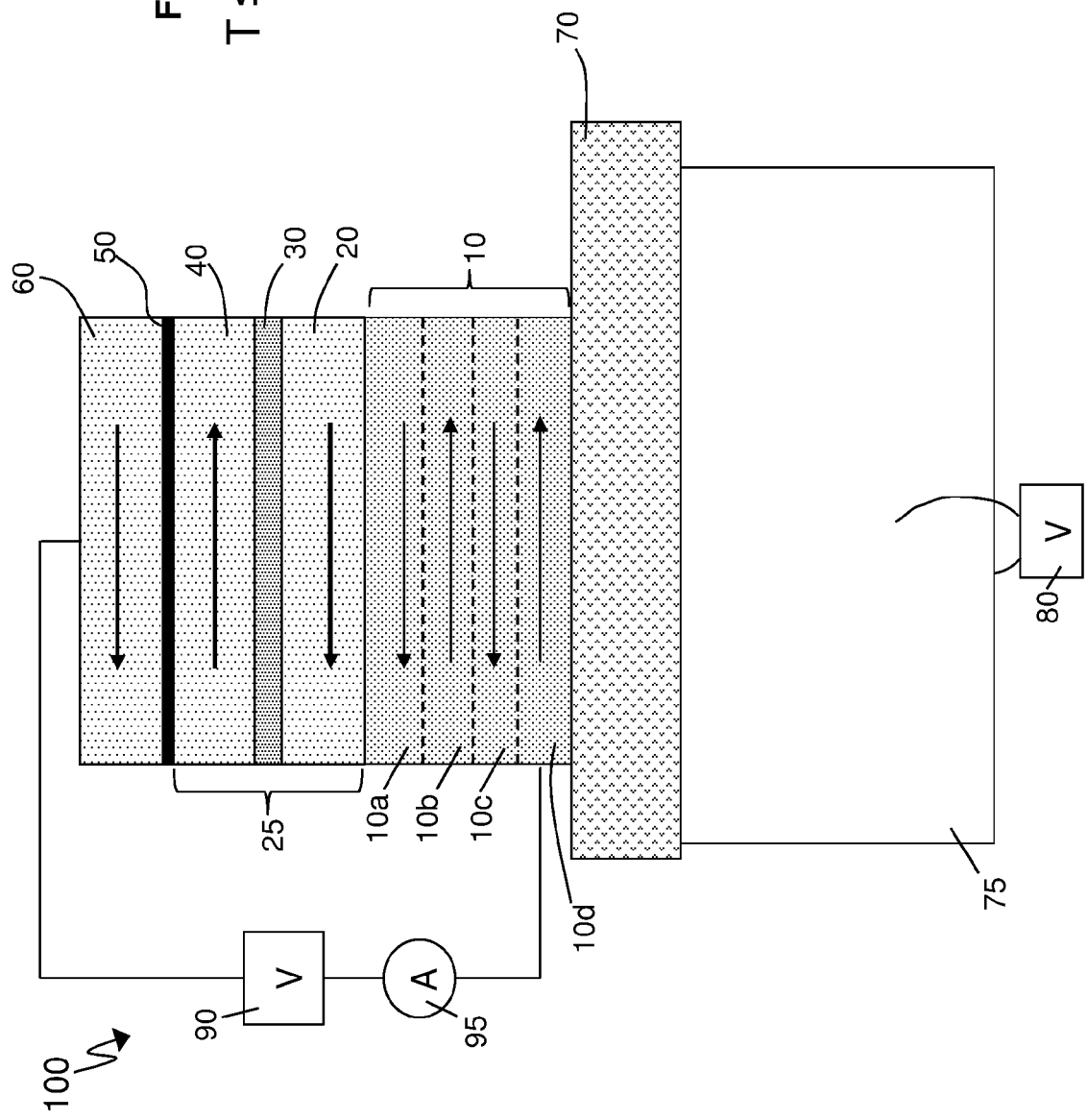
FIG. 1 is a structure for a thermally-assisted magnetoresistive random access memory (TAS-MRAM) device according to an embodiment.

FIG. 1 illustrates a structure for a thermally-assisted magnetoresistive random access memory (TAS-MRAM) device 100 according to an embodiment. The TAS-MRAM device 100 is designed to reduce, eliminate, and/or nearly eliminate the stray fields that need to be overcome during writing (i.e., data storage).

The TAS-MRAM device 100 is a structure that includes an antiferromagnetic layer 10. The antiferromagnetic layer 10 is an antiferromagnet and may include materials such as, e.g., IrMn, FeMn, PtMn, etc. The antiferromagnetic layer 10 may be composed of two magnetic sublattices. The two magnetic sublattices have opposite magnetic orientations (also referred to as a magnetic moments), such that the net magnetic moment of the antiferromagnetic layer 10 is zero. This is schematically shown in the FIG. 1 as a layered structure (antiferromagnetic layer 10 with one magnetic sublattice composed of layers 10a and 10c, and the second sublattice composed of layers 10b and 10d), though in reality the magnetic structure may be more complicated than simple layers. The magnetic orientation (magnetic moment) of a layer is shown by an arrow pointing left or right. For example, the top magnetic layer 10a has a left magnetic orientation while its adjacent magnetic layer 10b has a right magnetic orientation, and so forth for magnetic layer 10c and layer 10d in the antiferromagnetic layer 10. Since antiferromagnets have a small or no net magnetization, their spin orientation is only weakly influenced by an externally applied magnetic field.

A first ferromagnetic storage layer 20 is disposed on top of the antiferromagnetic layer 10, a non-magnetic coupling layer 30 is disposed on top of the first ferromagnetic storage layer 20, and a second ferromagnetic storage layer 40 is disposed on top of the non-magnetic coupling layer 30. The first ferromagnetic storage layer 20, the non-magnetic coupling layer 30, and the second ferromagnetic storage layer 40 together form and act as a (single) synthetic antiferromagnetic storage layer 25 used to store data, which has a net magnetization moment equal to and/or close to zero. The synthetic antiferromagnetic storage layer 25 acts as a single layer called the storage layer, and the coupling between the first ferromagnetic storage layer 20, through the non-magnetic coupling layer 30, to the second ferromagnetic storage layer 40 is referred to as RKKY (Ruderman-Kittel-Kasuya-Yosida) coupling. The non-magnetic coupling layer 30 may be a metallic spacer (e.g., Ruthenium), which holds (i.e., fixes) the first ferromagnetic storage layer 20 and the second ferromagnetic storage layer 40 at opposite magnetic orientations (i.e., couples the first ferromagnetic storage layer 20 and the second ferromagnetic storage layer 40 in antiparallel magnetic orientations). The first ferromagnetic storage layer 20 is shown with a left magnetic orientation (i.e., left pointing arrow), and the second ferromagnetic storage layer 40 is shown with a right magnetic orientation (i.e., right pointing arrow). Note that the first ferromagnetic storage layer 20, the non-magnetic coupling layer 30, and the second ferromagnetic storage layer 40 are pinned in place during storage (i.e., when the temperature (T) of the MRAM device 100 is less than or equal to the storage temperature $T_{store}$). The magnetic orientations of the first ferromagnetic storage layer 20 and the second ferromagnetic storage layer 40 acting as the synthetic antiferromagnetic storage layer 25 are held in place the by the exchange coupling to antiferromagnetic layer 10.

The MRAM device 100 also includes a non-magnetic tunnel barrier 50 disposed on the second ferromagnetic storage layer 40, and a ferromagnetic sense layer 60 disposed on non-magnetic tunnel barrier 50, which are used to read out the MRAM device 100. The non-magnetic tunnel barrier 50 may be $Al_2O_3$ or MgO. The magnetic tunnel junction (MTJ) includes the second ferromagnetic storage layer 40, the non-magnetic tunnel barrier 50, and the ferromagnetic sense layer 60. Antiferromagnetic layer 10 is preferably (but not necessarily) IrMn, FeMn, PtMn, or an alloy or multilayer of these materials or any another metallic antiferromagnet. Layers 20, 40, and 60 are alloys containing at least one of Fe, Co, and Ni (or any combination thereof), such as for example, CoFeB. Layers 40 and 60 also contain a significant fraction of a nonmagnetic element, for example Ta, in order to reduce the Curie temperature. Layers 40 and 60 are preferably (but not necessarily) CoFeTaB alloys or multilayers. Layer 20 is preferably (but not necessarily) CoFe. Layer 30 is preferably (but not necessarily) Ru, but could also be Jr, Cu, an alloy of any of these, or any other material which gives RKKY coupling.

An embodiment describes how to reduce stray fields by using ferromagnets of ferromagnetic layers 40 and 60 whose magnetization is strongly temperature dependent on temperature in the range of temperature, T, defined by $T_{store} < T < T_{write}$, so that at $T_{write}$, the magnetization of one or more of the ferromagnetic layers 40 and 60 is significantly reduced from their magnetization (value) as compared to at $T_{store}$. The temperature T is the temperature of the MRAM device. Reducing stray fields reduces the strength of the applied write field (e.g., generated via voltage source 80 and wire 75) needed for writing and reading, and therefore the power, required to read and write to the MRAM device 100.

For optimum performance of the MRAM device 100, the temperature dependence of the ferromagnetic layers 40 and 60 must be such that the critical temperature of the ferromagnetism, $T_{c,f}$ is similar to the critical temperature of the antiferromagnetism, $T_{c,af}$ and that both are below the write temperature (the temperature the device 100 is heated to during writing) This is so that when the MRAM device 100 cools in the write field (i.e., cools with the desired magnetic orientation set by the applied magnetic write field generated via electrical current flowing through the wire 75 as understood by one skilled in the art) during the write process, the magnetization of the ferromagnetic storage layer 20 (which is still strongly magnetic at the write temperature) provides exchange bias to reset the antiferromagnet (of the antiferromagnetic layer 10) with the exchange bias parallel to the ferromagnetic storage layer's 20 magnetization as the antiferromagnet (of the antiferromagnetic layer 10) cools. The critical temperature for ferromagnets is the Curie temperature of the materials, and the critical temperature of antiferromagnets is the Néel temperature. The Curie temperature, or Curie point, is the temperature at which a ferromagnetic material becomes paramagnetic on heating; the effect is reversible. A magnet will lose its magnetism (i.e., m=0) if heated above the Curie temperature. The analogous temperature in antiferromagnetic materials at which antiferromagnet lose their magnetism (i.e., m=0) is the Néel temperature. For a write temperature of 370 C, the preferred (but not a necessity) critical temperature for ferromagnetic layers 40 and 60 and the antiferromagnetic layer 10 is 330 C. It does not matter what the relative order of the critical temperatures for layers 10, 40, and 60 are. What does matter is that they are all below the write temperature (370 C), and well above the storage temperature (which might be 150 C). The other thing that matters is that the critical temperature for layer 20 is well above the write temperature. The preferred (but not a necessity) critical temperature for layer 20 is 500 C.

Exchange bias refers to the exchange bias field produced by the antiferromagnetic layer 10 on the adjacent ferromagnetic storage layer 20 to pin the magnetic orientation of the ferromagnetic storage layer 20 to be parallel with the magnetic orientation of the top layer 10a in the antiferromagnetic layer 10. Accordingly, the top layer 10a pins the magnetic orientation of the ferromagnetic storage layer 20 to the left in FIG. 1. As noted above, the synthetic antiferromagnetic storage layer 25 includes the first ferromagnetic storage layer 20, the non-magnetic coupling layer 30 (that couples ferromagnetic storage layers 20 and 40 in opposite magnetic orientations), and the second ferromagnetic storage layer 40, all of which act as a single layer. Accordingly, the exchange bias or exchange coupling (i.e., magnetic field) of the antiferromagnetic layer 10 pins the synthetic antiferromagnetic storage layer 25 in place (i.e., pins the magnetic orientation of each layer in the synthetic antiferromagnetic storage layer 25.

An insulator layer 70 (such as silicon dioxide) may be disposed underneath the antiferromagnetic layer 10, and a wire 75 (e.g., metal) may be disposed underneath the insulator 70. A voltage source 80 is connected to the wire 75 to generate a write magnetic field to write a logic "1" or "0" to the MRAM device 100. A logic 1 may correspond to a high resistance in which the magnetic orientation of the ferromagnetic storage layer 40 and the ferromagnetic sense layer 60 are antiparallel (i.e., the arrows point in opposite directions), which causes the resistance through the non-magnetic tunnel barrier 50 to be high. A logic 0 may correspond to a low resistance in which the magnetic orientation of the ferromagnetic storage layer 40 and the ferromagnetic sense layer 60 are parallel (i.e., the arrows point in same direction), which causes the resistance through the non-magnetic tunnel barrier 50 to be low.

Typically, one would want to apply a magnetic field (directly to the ferromagnetic storage layer 40) to flip the magnetic orientation of the ferromagnetic storage layer 40 to write to the MRAM device. However, FIG. 4 illustrates an example operation mode 400 for writing data to the MRAM device 100 that reduces (eliminates or nearly eliminates) stray magnetic fields originating from the ferromagnetic storage layer 40 and the ferromagnetic sense layer 60), thus requiring less power to be output by the voltage source 80 according to an embodiment.

At block 405, a write current is passed vertically through the MRAM device 100 to heat the MRAM device 100 to the write temperature $T_{write}$.

A voltage source 90 provides the voltage to generate the electrical write current in the MRAM device 100. For example, the write current flows into the ferromagnetic sense layer 60, in the non-magnetic tunnel barrier 50, in the second ferromagnetic storage layer 40, in the non-magnetic coupling layer 30, in the first ferromagnetic storage layer 20, and out to through the antiferromagnetic layer 10 (and back to the voltage source 90 via an ammeter 95). The write current flowing through the above layers of the MRAM device 100 generates heat to increase the temperature from $T_{store}$ to $T_{write}$. The non-magnetic tunnel barrier 50 typically generates the most heat by Joule heating.

At block 410, the increased temperature (to $T_{write}$) results in the second ferromagnetic storage layer 40 and the ferromagnetic sense layer 60 having significantly reduced magnetization, while the magnetization of first ferromagnetic storage layer 20 remains constant or does not decrease by as much as second ferromagnetic storage layer 40 and the ferromagnetic sense layer 60. The write temperature ($T_{write}$) is higher than the critical temperature for the ferromagnetic storage layer 40, the ferromagnetic sense layer 60, and the antiferromagnetic layer 10. As such, the ferromagnetism of ferromagnetic storage layer 40 decreases to zero and/or nearly zero, such that no (and/or very little) magnetic stray fields originate from the ferromagnetic storage layer 40 to (negatively) affect the applied write field that eventually flips the magnetic orientation of the first ferromagnetic storage layer 20. Similarly, the ferromagnetism of ferromagnetic sense layer 60 decreases to zero and/or nearly zero, such that no (and/or very little) magnetic stray fields originate from the ferromagnetic sense layer 60 to (negatively) affect the applied write field that eventually flips the magnetic orientation of the first ferromagnetic storage layer 20. Also, the write temperature de-pins the antiferromagnetic layer 10 from the first ferromagnetic storage layer 20 so that the magnetic orientation of the now de-pinned first ferromagnetic storage layer 20 can be flipped when the magnetic write field is applied by the voltage source 80 and wire 75.

Figure 2:
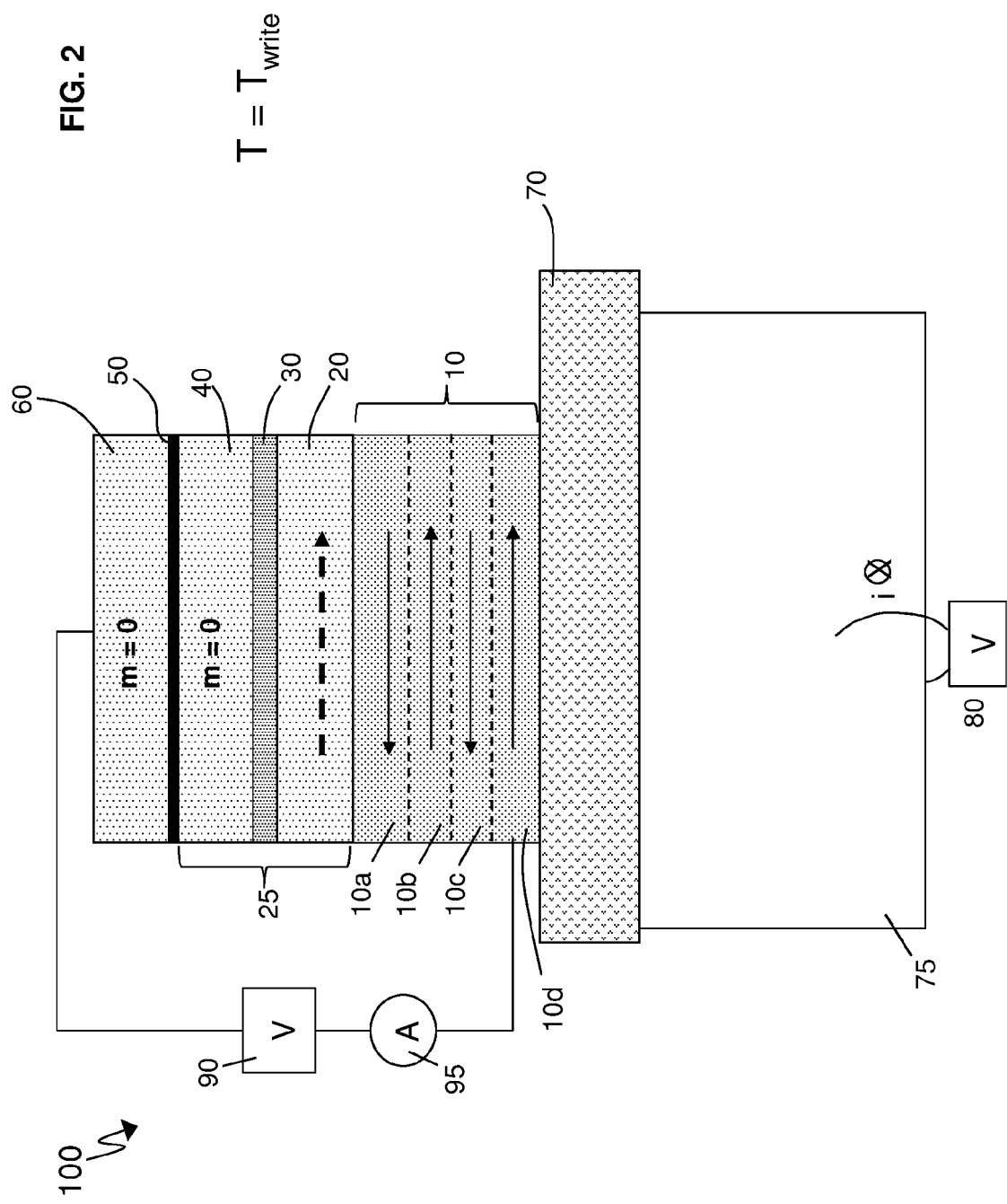
FIG. 2 illustrates the thermally-assisted magnetoresistive random access memory device when heated for writing according to an embodiment.

FIG. 2 shows the thermally-assisted magnetoresistive random access memory device 100 where the temperature (T) of the MRAM device 100 is now equal to the write temperature ($T_{write}$), which reduces stray magnetic fields as discussed herein. By reaching the write temperature, the critical temperature (i.e., Curie temperature) of the second ferromagnetic storage layer 40 and the ferromagnetic sense layer 60 are reached (and/or exceeded) which causes their magnetization moment (also referred to as magnetization) to equal zero (nearly equal zero and/or be dramatically reduced). Correspondingly, the stray magnetic fields from the second ferromagnetic storage layer 40 and the ferromagnetic sense layer 60 equal zero (nearly equal zero or are dramatically reduced). As a result, the stray fields (i.e., magnetization) of the second ferromagnetic storage layer 40 and the ferromagnetic sense layer 60 do not affect or counter the applied write field (by voltage source 80 generating current for the wire 75), Also, by the MRAM device 100 being heated to the write temperature, the first ferromagnetic storage layer 20 is temporarily decoupled from the antiferromagnetic layer 10, which results in the first ferromagnetic storage layer 20 no longer being pinned to the antiferromagnetic layer 10 (at this time).

Continuing with FIG. 4, at block 415, a (magnetic) write field is now applied (e.g., by the voltage source 80 and wire 75) to the MRAM device 100 to reorient the magnetization direction of first ferromagnetic storage layer 20 to the desired direction for writing a logic "1" or logic "0". Since the magnetizations (i.e., the respective ferromagnetisms) of the second ferromagnetic storage layer 40 and the ferromagnetic sense layer 60 are reduced substantially (e.g., equal or nearly equals zero), and the exchange bias provided by the antiferromagnetic layer 10 is also reduced substantially, a modest write field magnitude (generated by the voltage source 80) can switch the magnetization direction of the ferromagnetic storage layer 20 (with out contending with stray magnetic fields). An example of a modest write field magnitude is 100 Oe (Oersted) (for a 100 nm diameter MRAM device 100) and the corresponding voltage of the voltage source 80 is 1V. However, the write field magnitude required for a conventional 100 nm diameter MRAM device would be 200 Oe, thus requiring twice as much voltage from the voltage source 80. Note that the current through the wire 75 from the voltage source 80 flows in and out of the page, so as at to create the desired magnetic field that points left or right.

At block 420, the write current (generated by the voltage source 90) to heat the MRAM device 100 is reduced back to zero, and the MRAM device 100 cools in the presence of magnetic write field all while the magnetizations (ferromagnetisms) of ferromagnetic storage layer 40 and the ferromagnetic sense layer 60 increase back to normal. Also, the antiferromagnetism of the antiferromagnetic layer 10 increases back to normal. In general, ferromagnetic storage layer 40 and the ferromagnetic sense layer 60 usually have a lower magnetization (strength) than first ferromagnetic storage layer 20.

For example, the write field continues to hold the magnetic orientation of the ferromagnetic storage layer 20 to the right as the MRAM device 100 cools, all while the ferromagnetic storage layer 40 and the ferromagnetic sense layer 60 initially have little to no magnetization (i.e., magnetic moment m=0 for both). The right magnetic orientation of the ferromagnetic storage layer 20 is shown with a dashed line in FIG. 2, which represents the direction being held in place by the applied write field (even as the MRAM device 100 cools). As the MRAM device 100 cools (from the write temperature $T_{write}$) back to the storage temperature $T_{store}$, the magnetizations of ferromagnetic storage layer 40 and the ferromagnetic sense layer 60 increase back to normal. The magnetization orientation (now right magnetization orientation) of the ferromagnetic storage layer 20 causes the ferromagnetic storage layer 40 to be opposite in magnetization orientation to the ferromagnetic storage layer 20 because of the non-magnetic coupling layer 30 shown in FIG. 3. Accordingly, the ferromagnetic storage layer 40 now has a left magnetic orientation. Also, note that as the temperature of the MRAM device 100 cools back to (and/or less than) the storage temperature $T_{store}$, the antiferromagnetic layer 10 is coupled (i.e., re-pinned) back to the ferromagnetic storage layer 20 (such that the top layer 10a maintains the same magnetic orientation as the ferromagnetic storage layer 20) as shown in FIG. 3. The magnetic orientation of the top layer 10a has now been reoriented by the ferromagnetic storage layer 20, and the remaining layers 10b through 10d switch accordingly to maintain a net magnetization equal to zero.

At block 425, the write field is reduced back to zero by turning off the voltage source 80, and the MRAM device 100 has been stored with the desired magnetization orientation. FIG. 3 shows the thermally-assisted magnetoresistive random access memory device 100 where the temperature (T) of the MRAM device 100 is now equal to (or less than) the storage temperature ($T_{store}$). As can be seen, the magnetic orientation of the first ferromagnetic storage layer 20 has been switched to the right, which flips the magnetic orientation of the ferromagnetic storage layer 40 to the left. Similarly, FIG. 3 shows that the individual magnetic orientations of the layers 10a through 10d have all been switched accordingly.

It can be appreciated that other methods to write data into this (memory device) MRAM device 100 exist and are not meant to be excluded.

The following discusses an example of reading the stored data.

1) A read field (e.g., via the voltage source 80 or a magnetic field generating device not shown) is applied to the MRAM device 100 in a first direction at any temperature $T<T_{store}$. Since the ferromagnetic storage layer 20 and ferromagnetic storage layer 40 form the synthetic antiferromagnetic storage layer 25, the stray field incident on the ferromagnetic sense layer 60 (from the synthetic antiferromagnetic storage layer 25) is negligible and only a modest read field magnitude is required to switch the ferromagnetic sense layer 60.

2) The resistance of the MRAM device is measured from top to bottom (e.g., from layer 60 through layer 10). In one case, a small voltage may be applied by the voltage source 90 and the ammeter 95 reads the current, and the resistance is determined.

3) The read field is reduced back to zero.

4) A read field is applied to the MRAM device 100 but in a second direction opposite to the first direction at any temperature $T<T_{store}$. Since the ferromagnetic storage layer 20 and ferromagnetic storage layer 40 form the synthetic antiferromagnet 25, the stray field incident on the ferromagnetic sense layer 60 is negligible and only a modest read field magnitude is required to switch the ferromagnetic sense layer 60.

5) The resistance of the MRAM device 100 is measured from top to bottom again, and the read field is reduced back to zero.

It can be appreciated that other methods to read data from this memory device exist and are not meant to be excluded.

Note that an antiferromagnet is a homogenous material with two microscopic magnetic sublattices that have equal but opposite magnetic moments. A synthetic antiferromagnet is a trilayer structure: two magnetic layers (of roughly equal moment) sandwiched around a nonmagnetic spacer which couples the magnetic moments of the two magnetic layers to be antiparallel.

FIG. 5 illustrates a method 500 for writing to the thermally assisted magnetoresistive random access memory (MRAM) device 100 according to an embodiment. Reference can be made to FIGS. 1-4.

The voltage source 90 applies a write current to heat the MRAM device 100 to a write temperature $T_{write}$ at block 505. The MRAM device 100 includes an antiferromagnetic layer and a synthetic antiferromagnetic layer disposed on the antiferromagnetic layer. The synthetic antiferromagnetic layer includes a first ferromagnetic storage layer, a non-magnetic coupling layer disposed on the first ferromagnetic storage layer, and a second ferromagnetic storage layer disposed on the non-magnetic coupling layer. The MRAM device 100 further includes a non-magnetic tunnel barrier disposed on the second ferromagnetic storage layer and a ferromagnetic sense layer disposed on the non-magnetic tunnel barrier.

At block 510, the respective ferromagnetisms in the second ferromagnetic storage layer and the ferromagnetic sense layer are lost (i.e., temporarily demagnetized) from the heat, resulting in reduced stray magnetic fields generated by the second ferromagnetic storage layer and the ferromagnetic sense layer.

At block 515, the voltage source 80 applies a magnetic write field (via the wire 75) that interacts with the ferromagnetism of the first ferromagnetic storage layer, and the write field switches a first magnetic orientation of the first ferromagnetic storage layer. The ferromagnetism of the first ferromagnetic storage layer is not lost (i.e., not demagnetized) by the heat at the write temperature.

At block 520, when the write current is removed to cool the MRAM device 100 below the write temperature, exchange bias of the first ferromagnetic storage layer switches a second magnetic orientation of the second ferromagnetic storage layer according to the first magnetic orientation of the first ferromagnetic storage layer that has been switched.

The individual ferromagnetisms of the second ferromagnetic storage layer and the ferromagnetic sense layer return to normal when the MRAM device 100 cools, which allows the exchange bias of the first ferromagnetic storage layer to switch the second magnetic orientation of the second ferromagnetic storage layer.

The first ferromagnetic critical temperature (i.e., Curie temperature) of the first ferromagnetic storage layer is higher than an antiferromagnetic critical temperature (i.e., Néel temperature) of the antiferromagnetic layer, is higher than a second ferromagnetic critical temperature of the second ferromagnetic storage layer, and is higher than a third ferromagnetic critical temperature of the ferromagnetic sense layer.

In one case, the second ferromagnetic critical temperature of the second ferromagnetic storage layer and the third ferromagnetic critical temperature of the ferromagnetic sense layer are both higher than the antiferromagnetic critical temperature of the antiferromagnetic layer. In another case, the antiferromagnetic critical temperature of the antiferromagnetic layer is higher than both the second ferromagnetic critical temperature of the second ferromagnetic storage layer and the third ferromagnetic critical temperature of the ferromagnetic sense layer.

The second ferromagnetic critical temperature of the second ferromagnetic storage layer and the third ferromagnetic critical temperature of the ferromagnetic sense layer are the same or about the same (i.e., they are the same materials and/or their materials have the about the same Curie temperatures). However, in one case, the second ferromagnetic critical temperature of the second ferromagnetic storage layer and the third ferromagnetic critical temperature of the ferromagnetic sense layer are different.

The second ferromagnetic critical temperature of the second ferromagnetic storage layer is higher than the third ferromagnetic critical temperature of the ferromagnetic sense layer, or the second ferromagnetic critical temperature of the second ferromagnetic storage layer is lower than the third ferromagnetic critical temperature of the ferromagnetic sense layer.

The second ferromagnetic storage layer has ferromagnetic material that loses ferromagnetism at the second ferromagnetic critical temperature, and ferromagnetic sense layer has ferromagnetic material that loses ferromagnetism at the third ferromagnetic critical temperature.

Figure 6:
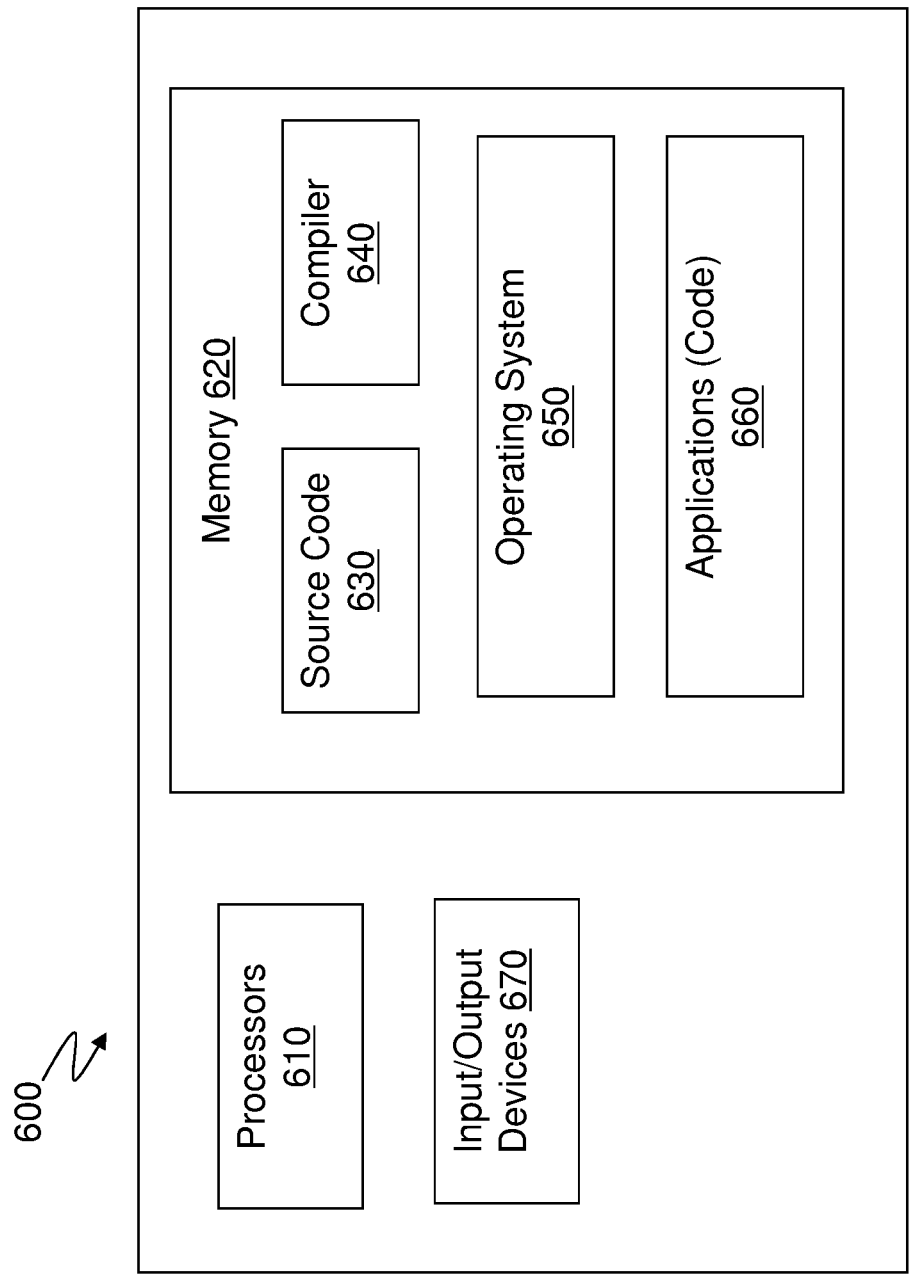
FIG. 6 is an example of a computer which can be connected to, operate, and/or include an array of TAS-MRAM devices according to an embodiment.

FIG. 6 illustrates an example of a computer 600 which may include and/or operate the MRAM device 100 (e.g., such as an array of MRAM devices 100) as memory 620. Various methods, procedures, modules, flow diagrams, tools, applications, circuits, elements, and techniques discussed herein may also incorporate and/or utilize the capabilities of the computer 600. Moreover, capabilities of the computer 600 may be utilized to implement features of exemplary embodiments discussed herein including the voltage sources 80, 90 and the logic circuitry to operate an array of MRAM devices 100 (as understood by one skilled in the art). One or more of the capabilities of the computer 600 may be utilized to implement, to incorporate, to connect to, and/or to support any element discussed herein (as understood by one skilled in the art) in FIGS. 1-5.

Generally, in terms of hardware architecture, the computer 600 may include one or more processors 610, computer readable storage memory 620, and one or more input and/or output (I/O) devices 670 that are communicatively coupled via a local interface (not shown). The local interface can be, for example but not limited to, one or more buses or other wired or wireless connections, as is known in the art. The local interface may have additional elements, such as controllers, buffers (caches), drivers, repeaters, and receivers, to enable communications. Further, the local interface may include address, control, and/or data connections to enable appropriate communications among the aforementioned components.

The processor 610 is a hardware device for executing software that can be stored in the memory 620. The processor 610 can be virtually any custom made or commercially available processor, a central processing unit (CPU), a data signal processor (DSP), or an auxiliary processor among several processors associated with the computer 600, and the processor 610 may be a semiconductor based microprocessor (in the form of a microchip) or a microprocessor.

The computer readable memory 620 can include any one or combination of volatile memory elements (e.g., random access memory (RAM), such as dynamic random access memory (DRAM), static random access memory (SRAM), etc.) and nonvolatile memory elements (e.g., ROM, erasable programmable read only memory (EPROM), electronically erasable programmable read only memory (EEPROM), programmable read only memory (PROM), tape, compact disc read only memory (CD-ROM), disk, diskette, cartridge, cassette or the like, etc.). Moreover, the memory 620 may incorporate electronic, magnetic, optical, and/or other types of storage media. Note that the memory 620 can have a distributed architecture, where various components are situated remote from one another, but can be accessed by the processor 610.

The software in the computer readable memory 620 may include one or more separate programs, each of which comprises an ordered listing of executable instructions for implementing logical functions. The software in the memory 620 includes a suitable operating system (O/S) 650, compiler 640, source code 630, and one or more applications 660 of the exemplary embodiments. As illustrated, the application 660 comprises numerous functional components for implementing the features, processes, methods, functions, and operations of the exemplary embodiments. The application 660 of the computer 600 may represent numerous applications, agents, software components, modules, interfaces, controllers, etc., as discussed herein but the application 660 is not meant to be a limitation.

The operating system 650 may control the execution of other computer programs, and provides scheduling, input-output control, file and data management, memory management, and communication control and related services.

The application 660 may be a source program, executable program (object code), script, or any other entity comprising a set of instructions to be performed. When a source program, then the program is usually translated via a compiler (such as the compiler 640), assembler, interpreter, or the like, which may or may not be included within the memory 620, so as to operate properly in connection with the O/S 650. Furthermore, the application 660 can be written as (a) an object oriented programming language, which has classes of data and methods, or (b) a procedure programming language, which has routines, subroutines, and/or functions.

The I/O devices 670 may include input devices (or peripherals) such as, for example but not limited to, a mouse, keyboard, scanner, microphone, camera, etc. Furthermore, the I/O devices 670 may also include output devices (or peripherals), for example but not limited to, a printer, display, etc. Finally, the I/O devices 670 may further include devices that communicate both inputs and outputs, for instance but not limited to, a NIC or modulator/demodulator (for accessing remote devices, other files, devices, systems, or a network), a radio frequency (RF) or other transceiver, a telephonic interface, a bridge, a router, etc. The I/O devices 670 also include components for communicating over various networks, such as the Internet or an intranet. The I/O devices 670 may be connected to and/or communicate with the processor 610 utilizing Bluetooth connections and cables (via, e.g., Universal Serial Bus (USB) ports, serial ports, parallel ports, FireWire, HDMI (High-Definition Multimedia Interface), etc.).

When the computer 600 is in operation, the processor 610 is configured to execute software stored within the memory 620, to communicate data to and from the memory 620, and to generally control operations of the computer 600 pursuant to the software. The application 660 and the O/S 650 are read, in whole or in part, by the processor 610, perhaps buffered within the processor 610, and then executed.

When the application 660 is implemented in software it should be noted that the application 660 can be stored on virtually any computer readable storage medium for use by or in connection with any computer related system or method.

The application 660 can be embodied in any computer-readable medium for use by or in connection with an instruction execution system, apparatus, server, or device, such as a computer-based system, processor-containing system, or other system that can fetch the instructions from the instruction execution system, apparatus, or device and execute the instructions.

In exemplary embodiments, where the application 660 is implemented in hardware, the application 660 can be implemented with any one or a combination of the following technologies, which are each well known in the art: a discrete logic circuit(s) having logic gates for implementing logic functions upon data signals, an application specific integrated circuit (ASIC) having appropriate combinational logic gates, a programmable gate array(s) (PGA), a field programmable gate array (FPGA), etc.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A thermally assisted magnetoresistive random access memory device, comprising:
    an antiferromagnetic layer;
    a synthetic antiferromagnetic layer disposed on the antiferromagnetic layer, wherein the synthetic antiferromagnetic layer comprises a first ferromagnetic storage layer, a non-magnetic coupling layer disposed on the first ferromagnetic storage layer, and a second ferromagnetic storage layer disposed on the non-magnetic coupling layer;
    a non-magnetic tunnel barrier disposed on the second ferromagnetic storage layer; and
    a ferromagnetic sense layer disposed on the non-magnetic tunnel barrier;
    wherein a first ferromagnetic critical temperature of the first ferromagnetic storage layer is higher than an antiferromagnetic critical temperature of the antiferromagnetic layer, is higher than a second ferromagnetic critical temperature of the second ferromagnetic storage layer, and is higher than a third ferromagnetic critical temperature of the ferromagnetic sense layer.

2. The device of claim 1, wherein the second ferromagnetic critical temperature of the second ferromagnetic storage layer and the third ferromagnetic critical temperature of the ferromagnetic sense layer are both higher than the antiferromagnetic critical temperature of the antiferromagnetic layer.

3. The device of claim 1, wherein the antiferromagnetic critical temperature of the antiferromagnetic layer is higher than both the second ferromagnetic critical temperature of the second ferromagnetic storage layer and the third ferromagnetic critical temperature of the ferromagnetic sense layer.

4. The device of claim 1, wherein the second ferromagnetic critical temperature of the second ferromagnetic storage layer and the third ferromagnetic critical temperature of the ferromagnetic sense layer are the same or about the same.

5. The device of claim 1, wherein the second ferromagnetic critical temperature of the second ferromagnetic storage layer and the third ferromagnetic critical temperature of the ferromagnetic sense layer are different.

6. The device of claim 1, wherein the second ferromagnetic critical temperature of the second ferromagnetic storage layer is higher than the third ferromagnetic critical temperature of the ferromagnetic sense layer.

7. The device of claim 1, wherein the second ferromagnetic critical temperature of the second ferromagnetic storage layer is lower than the third ferromagnetic critical temperature of the ferromagnetic sense layer.

8. The device of claim 1, wherein the second ferromagnetic storage layer comprises ferromagnetic material that loses ferromagnetism at the second ferromagnetic critical temperature.

9. The device of claim 1, wherein the ferromagnetic sense layer comprises ferromagnetic material that loses ferromagnetism at the third ferromagnetic critical temperature.

10. The device of claim 1, wherein both the second ferromagnetic storage layer and the ferromagnetic sense layer lose respective ferromagnetisms during heating for a writing process resulting in little or no respective ferromagnetisms, while the first ferromagnetic storage layer maintains ferromagnetism during the heating for the writing process.

11. The device of claim 10, wherein, during the write process, the first ferromagnetic storage layer switches a first magnetic orientation when a magnetic write field interacts with the ferromagnetism of the first ferromagnetic storage layer;
  wherein the magnetic write field does not interact with the respective ferromagnetisms of the second ferromagnetic storage layer and the ferromagnetic sense layer as the second ferromagnetic storage layer and the ferromagnetic sense layer have little or no respective ferromagnetisms.

12. The device of claim 11, wherein during cooling to a storage temperature, the respective ferromagnetisms of the second ferromagnetic storage layer and the ferromagnetic sense layer return, and the first magnetic orientation of the first ferromagnetic storage layer switches a second magnetic orientation of the second ferromagnetic storage layer to be antiparallel.

\* \* \* \* \*